(12) United States Patent
Matsumura

(10) Patent No.: US 6,784,546 B2
(45) Date of Patent: Aug. 31, 2004

(54) ELECTRODE STRUCTURE AND METHOD OF FABRICATING THE SAME

(75) Inventor: Akira Matsumura, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/133,743

(22) Filed: Apr. 29, 2002

(65) Prior Publication Data

US 2003/0022429 A1 Jan. 30, 2003

(30) Foreign Application Priority Data

Jul. 26, 2001 (JP) ......................................... 2001-225577

(51) Int. Cl.⁷ ............................................. H01L 23/52
(52) U.S. Cl. ................... 257/758; 257/315; 257/369; 257/377
(58) Field of Search ........................... 438/320, 230; 257/758, 296–324, 377, 369, 358

(56) References Cited

U.S. PATENT DOCUMENTS 6,171,917 B1 * 1/2001 Sun et al. ..................... 438/305

FOREIGN PATENT DOCUMENTS

JP 7-183513 7/1995
JP 408321613 * 12/1996

* cited by examiner

Primary Examiner—Nathan J. Flynn
Assistant Examiner—Leonardo Andújar
(74) Attorney, Agent, or Firm—McDermott Will & Emery LLP

(57) ABSTRACT

A reliable electrode structure capable of ensuring a sufficient width for a second conductive layer is provided. The electrode structure comprises a first conductive layer having first side walls and containing at least either polycrystalline silicon or amorphous silicon, a second conductive layer, formed on the first conductive layer, having second side walls and containing a metal and silicon, and side wall oxide films formed to be in contact with the first side walls and the second side walls. The first conductive layer and the second conductive layer contain nitrogen in the vicinity of the first and second side walls. The nitrogen concentration in the second side walls is larger than the nitrogen concentration in the first side walls.

13 Claims, 7 Drawing Sheets

ELECTRODE STRUCTURE AND METHOD OF FABRICATING THE SAME

BACKGROUND OF THE INVENTION

1. Field of the Invention

The present invention relates to an electrode structure and a method of fabricating the same, and more particularly, it relates to an electrode structure employed as a gate electrode of a semiconductor device and a method of fabricating the same.

2. Description of the Prior Art

A structure formed by a first layer of polysilicon, for example, and a second layer, located on the first layer, of metal silicide is recently employed for a gate electrode forming a semiconductor device, in order to reduce electric resistance. When such a gate electrode is applied to a DRAM (dynamic random access memory), for example, the gate electrode is first formed by etching, and side walls of the gate electrode and the upper surface of a semiconductor substrate are thereafter covered with a thermal oxide film for improving hot carrier resistance. When this step is employed, however, side surfaces of the second layer made of metal silicide such as tungsten silicide are more readily oxidized as compared with side surfaces of the first layer made of polysilicon, and hence oxide films abnormally grow on the side surfaces made of metal silicide. For example, Japanese Patent Laying-Open No. 7-183513 describes a technique of preventing such abnormal growth of oxide films.

FIG. 10 is a sectional view of a semiconductor device having a conventional electrode structure described in the aforementioned gazette. Referring to FIG. 10, insulator films 101 for element isolation are formed on a silicon substrate 100 in the conventional semiconductor device. Between the insulator films 101 for element isolation, a polysilicon film 103 is formed on the silicon substrate 100 through a gate oxide film 102. A source region 110 and a drain region 111 are formed in the silicon substrate 100 on both sides of the polysilicon film 103. Rounded portions 108 and bird's beaks 109 are formed on the side walls of the polysilicon film 103 to be in contact with the polysilicon film 103.

A natural oxide film 104 is formed on the polysilicon film 103. A tungsten silicide film 105 is formed on the natural oxide film 104. A silicon nitride film 106 is formed on the tungsten silicide film 105.

Silicon nitride films 107 are formed to be in contact with the silicon nitride film 106, the tungsten silicide film 105 and the natural oxide film 104.

This electrode structure is fabricated as follows: First, the gate oxide film 102 is deposited on the silicon substrate 100, and the polysilicon film 103, the natural oxide film 104, the tungsten silicide film 105 and the silicon nitride film 106 are deposited thereon in a layered manner. The silicon nitride film 106, the tungsten silicide film 105 and the natural oxide film 104 are patterned into the shapes shown in FIG. 10. The silicon nitride films 107 are formed to cover the silicon nitride film 106, the tungsten silicide film 105 and the natural oxide film 104, and fully etched back into the shapes shown in FIG. 10. Thereafter the polysilicon film 103 is etched into the shape shown in FIG. 10, and thereafter the side walls thereof are oxidized to form the rounded portions 108 and the bird's beaks 109.

According to this method, the side walls of the tungsten silicide film 105, covered with the silicon nitride films 107 in the oxidation step, are inhibited from abnormal oxidation. On the other hand, the side walls of the polysilicon film 103 covered with no nitride films are thermally oxidized through the oxidation step. Consequently, the gate electrode can be improved in reliability.

However, the conventional technique has the following problem: The silicon nitride films 107 are formed on the side walls of the tungsten silicide film 105. The width of the tungsten silicide film 105 is reduced due to the silicon nitride films 107. Therefore, the tungsten silicide film 105 is reduced in sectional area and increased in electric resistance. Thus, the reliability of the electrode structure is deteriorated due to a signal delay or the like.

SUMMARY OF THE INVENTION

Accordingly, the present invention has been proposed in order to solve the aforementioned problem, and an object thereof is to provide a reliable electrode structure.

The electrode structure according to the present invention includes a first conductive layer having a first side wall and containing at least either polycrystalline silicon or amorphous silicon, a second conductive layer, formed on the first conductive layer, having a second side wall and containing a metal and silicon, and a side wall oxide film formed to be in contact with the first side wall and the second side wall. The first conductive layer and the second conductive layer contain nitrogen in the vicinity of the first and second side walls. The nitrogen concentration in the second side wall is larger than the nitrogen concentration in the first side wall.

In the electrode structure having the aforementioned structure, the side wall oxide film is formed to be in contact with the first side wall and the second side wall, whereby the first and second side walls can be prevented from crystal defects. The nitrogen concentration in the second side wall is larger than the nitrogen concentration in the first side wall, whereby larger quantities of nitrogen are added to the second side wall containing the metal and silicon. Consequently, the growth rate of the side wall oxide film can be retarded on the second side wall, so that the side wall oxide film can be prevented from abnormal growth on the second side wall. Further, the side wall oxide film is formed on the second side wall so that no silicon nitride films are formed to be directly in contact with the second side wall, whereby a sufficient width can be ensured for the second conductive layer. Consequently, a reliable electrode structure having small conductive resistance can be provided.

Preferably, the nitrogen concentration in the second conductive layer is increased toward the second side wall.

Preferably, the nitrogen concentration in the first side wall is substantially identical to the nitrogen concentration in a central portion of the first conductive layer.

Preferably, the first conductive layer is formed on a semiconductor substrate.

Preferably, the electrode structure further includes a gate oxide film formed between the first conductive layer and the semiconductor substrate.

Preferably, the electrode structure further includes a surface oxide film formed on the semiconductor substrate continuing to the gate oxide film and the side wall oxide film.

Preferably, the first conductive layer has a portion reduced in width toward the semiconductor substrate. The electrode structure further comprises impurity regions formed on the semiconductor substrate on both sides of the first conductive layer.

Preferably, the electrode structure further includes a silicon nitride film formed to cover the side wall oxide film.

A method of fabricating an electrode structure according to the present invention includes steps of successively stacking a first layer containing at least either polycrystalline silicon or amorphous silicon and a second layer containing a metal and silicon, forming a second conductive layer by etching the second layer, doping the side walls of the second conductive layer with nitrogen by exposing the second conductive layer to an atmosphere containing nitrogen, forming a first conductive layer by etching the first layer through a mask of the second conductive layer having the side wall doped with nitrogen, and forming a side wall oxide film by oxidizing the side walls of the first and second conductive layers.

In the method of fabricating an electrode structure having the aforementioned structure, the side wall of the second conductive layer is doped with nitrogen for thereafter forming the first conductive layer by etching the first layer through the mask of the second conductive layer doped with nitrogen. Therefore, the side wall of the second conductive layer is doped with large quantities of nitrogen, while the side wall of the first conductive layer is hardly doped with nitrogen. Consequently, the side wall of the second conductive layer can be inhibited from abnormal oxidation in the step of forming the side wall oxide film by oxidizing the side walls of the first and second conductive layers. Further, the side wall oxide film is formed on the side wall of the second conductive layer, whereby the width of the second conductive layer can be increased as compared with a case of forming a silicon nitride film to be in contact with the side wall of the second conductive layer. Consequently, the second conductive layer can be increased in sectional area and reduced in conductive resistance, for providing a reliable electrode structure.

Preferably, the step of successively stacking the first layer and the second layer includes a step of successively stacking the first layer and the second layer on a semiconductor substrate.

Preferably, the method of fabricating an electrode structure further includes a step of implanting an impurity into the semiconductor substrate through masks of the first and second conductive layers after forming the side wall oxide film.

Preferably, the method of fabricating an electrode structure further includes steps of stacking a silicon oxide film and a silicon nitride film on the second layer and etching the silicon oxide film and the silicon nitride film. The step of forming the second conductive layer includes a step of etching the second layer through a mask of the etched silicon nitride film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to the drawings.

(First Embodiment)

Figure 1:
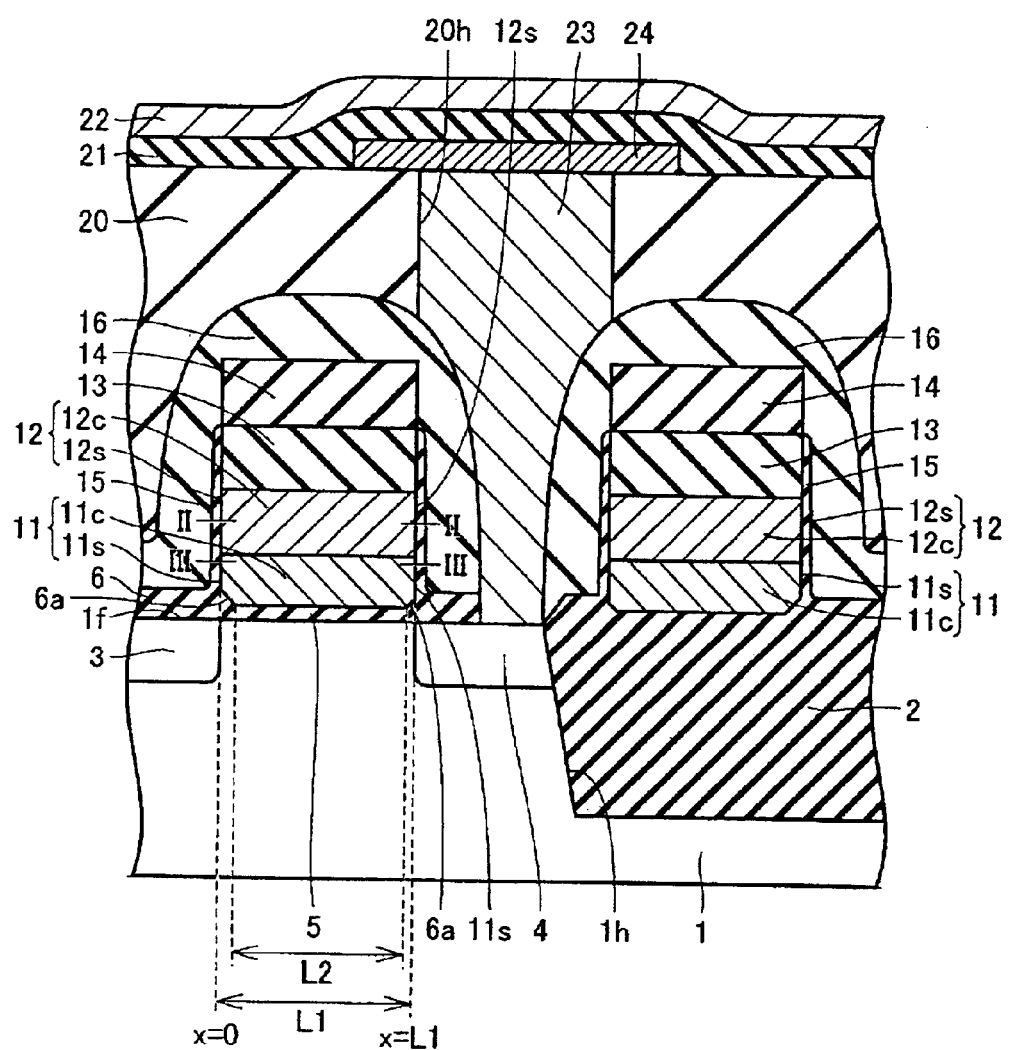
FIG. 1 is a sectional view of a semiconductor device having an electrode structure according to a first embodiment of the present invention.

Referring to FIG. 1, an electrode structure according to a first embodiment of the present invention includes a first conductive layer 11 having side walls 11s is as first side walls and containing at least either polycrystalline silicon or amorphous silicon, a second conductive layer 12, formed on the first conductive layer 11, having side walls 12s as second side walls and containing a metal and silicon, and side wall oxide films 15 formed to be in contact with the first and second side walls 11s and 12s. The first conductive layer 11 and the second conductive layer 12 contain nitrogen in the vicinity of the side walls 11s and 12s. The nitrogen concentration in the side walls 12s is larger than the nitrogen concentration in the side walls 11s.

The nitrogen concentration in the second conductive layer 12 is increased toward the side walls 12s. The nitrogen concentration in the side walls 11s is substantially identical to the nitrogen concentration in a central portion 11c of the first conductive layer 11.

The first conductive layer 11 is formed on a silicon substrate 1 employed as a semiconductor substrate.

The electrode structure further includes a gate oxide film 5 formed between the first conductive layer 11 and the silicon substrate 1. The first conductive layer 11 has a portion reduced in width toward the silicon substrate 1. The electrode structure further includes a source region 3 and a drain region 4 formed on the silicon substrate 1 as impurity regions on both sides of the first conductive layer 11. The electrode structure further includes a silicon nitride film 16 formed to cover the side wall oxide films 15.

A trench 1h is formed in the silicon substrate 1, so that an isolation film 2 of silicon oxide is formed in the trench 1h. The gate oxide film 5 and a surface oxide film 6 are formed on a main surface 1f of the silicon substrate 1. The surface oxide film 6 is larger in thickness than the gate oxide film 5.

The first conductive layer 11 is formed on the gate oxide film 5. The first conductive layer 11 contains at least either polycrystalline silicon or amorphous silicon. The first conductive layer 11 may be made of only polycrystalline silicon (polysilicon). Alternatively, the first conductive layer 11 may be made of only amorphous silicon. Further alternatively, the first conductive layer 11 may contain both amorphous silicon and polycrystalline silicon.

The first conductive layer 11 has the central portion 11c and the side walls 11s.

The second conductive layer 12 is formed to be in contact with the upper portion of the first conductive layer 11. The second conductive layer 12 is formed by a central portion 12c and the side walls 12s. The second conductive layer 12 contains a metal and silicon. The metal preferably includes at least one selected from a group consisting of tungsten, molybdenum, titanium, cobalt, tantalum and platinum. Therefore, the second conductive layer 12 is or may be made of tungsten silicide ($WSi_2$), molybdenum silicide ($MoSi_2$), titanium silicide ($TiSi_2$) cobalt silicide ($CoSi_2$), tantalum silicide ($TaSi_2$) or platinum silicide ($PtSi_2$).

A silicon oxide film 13 is formed on the second conductive layer 12. The silicon oxide film 13 is substantially identical in width to the first and second conductive layers 11 and 12.

A silicon nitride film 14 is formed on the silicon oxide film 13. The silicon nitride film 14 is also identical in width to the silicon oxide film 13.

The side wall oxide films 15 are formed to be directly in contact with the side walls 11s and 12s. Further, the side wall oxide films 15 are formed continuing to the surface oxide film 6. The silicon nitride film 16 is formed to cover the side wall oxide films 15.

A first conductive layer 11, a second conductive layer 12, a silicon oxide film 13, a silicon nitride film 14, side wall oxide films 15 and a silicon nitride film 16 similar to those formed on the main surface if are formed also on the isolation film 2.

An interlayer isolation film 20 is formed on the silicon substrate 1 to cover the silicon nitride film 16. The interlayer isolation film 20 consists of a silicon oxide film to which phosphorus or boron, for example, is added. A contact hole 20h is formed in the interlayer isolation film 20 to reach the drain region 4.

A plug layer 23 of polycrystalline silicon fills up the contact hole 20h. A lower electrode 24 of a capacitor is formed to be in contact with the plug layer 23. A dielectric layer 21 is formed on the lower electrode 24, while an upper electrode 22 is formed on the dielectric layer 21. The dielectric layer 21 can be formed not only by a silicon nitride film but also by a ferroelectric film of lead zirconate titanate or tantalum oxide. The lower electrode 24 can be cylindrically formed for improving the capacitance of the capacitor.

Figure 2:
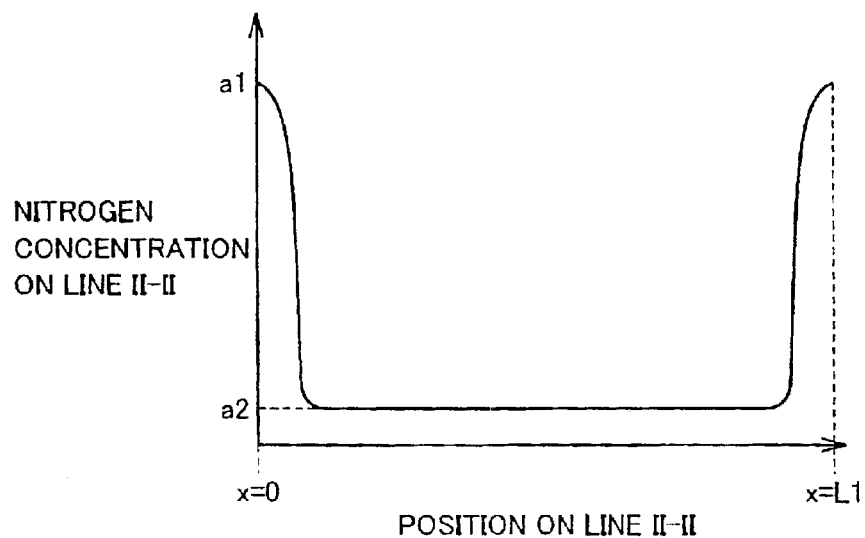
FIG. 2 is a graph showing distribution of nitrogen concentrations on a line II—II in FIG. 1.
Figure 3:
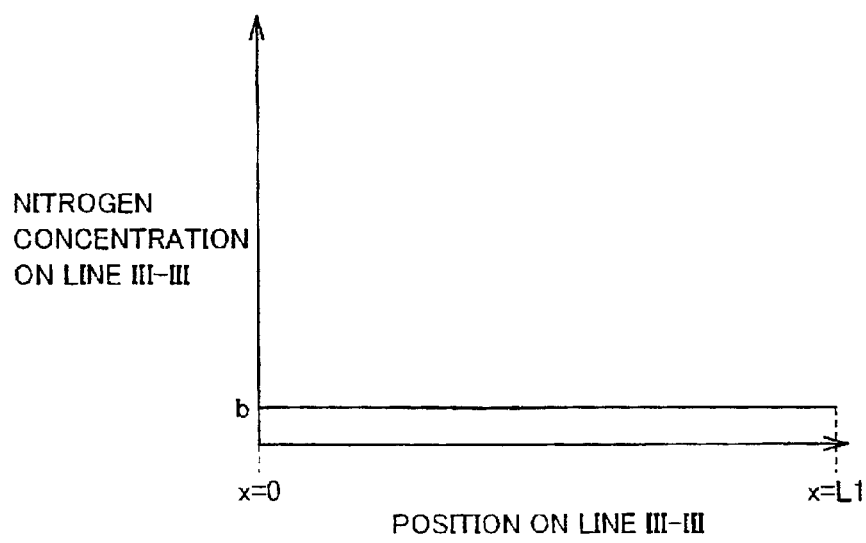
FIG. 3 is a graph showing distribution of nitrogen concentrations on a line III—III in FIG. 1.

Referring to FIG. 2, the nitrogen concentration in the second conductive layer 12 reaches the maximum value a1 ($1 \times 10^{17}$ cm$^{-3}$) on positions of x=0 and x=L1 on a line II—II in FIG. 1, i.e., on the side walls 12s. On the other hand, the nitrogen concentration reaches the minimum value a2 ($1 \times 10^{13}$ cm$^{-3}$) on the central portion 12c.

In the first conductive layer 11, the nitrogen concentration in the side walls 11s is substantially identical to the nitrogen concentration in the central portion 11s on a line III—III in FIG. 1. The nitrogen concentration on the line III—III is substantially at a constant value b ($1 \times 10^{13}$ cm$^{-3}$).

The width L1 of the first conductive layer 11 between the two side walls 11s is larger than the width L2 of the portion of the first conductive layer 11 in contact with the gate oxide film 5. This is because bird's beaks 6a are formed on the portion in contact with the gate oxide film 5 to reduce the width of the first conductive layer 11.

Figure 4:
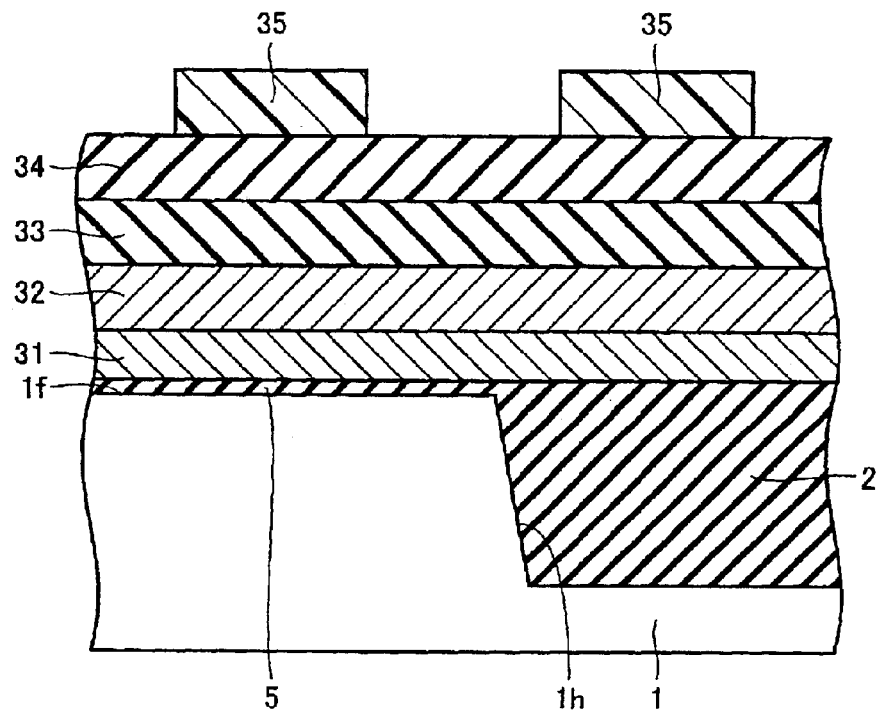
FIGS. 4 to 9 are sectional views showing first to sixth steps in a method of fabricating the electrode structure shown in FIG. 1.

A method of fabricating the semiconductor device shown in FIG. 1 is now described. Referring to FIG. 4, a resist film is applied onto the main surface if of the silicon substrate 1 and patterned by photolithography, for forming a resist pattern. The resist pattern is employed as a mask for etching the silicon substrate 1, thereby forming the trench 1h. The isolation film 2 of silicon oxide is formed to fill up the trench 1h. The main surface 1f of the silicon substrate 1 is oxidized to form the gate oxide film 5. A polysilicon film 31, a tungsten silicide film 32, a silicon oxide film 33 and a silicon nitride film 34 are successively stacked on the gate oxide film 5. A resist film is applied onto the silicon nitride film 34 and patterned by photolithography, thereby forming a resist pattern 35.

Figure 5:
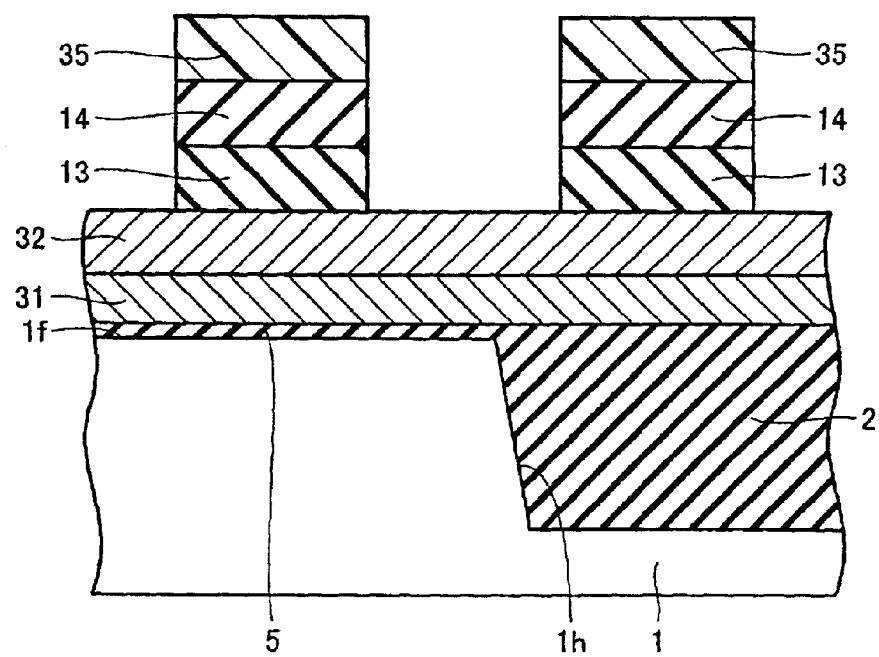

Referring to FIG. 5, the silicon nitride film 34 and the silicon oxide film 33 are etched through the resist pattern 35 serving as a mask, thereby forming the silicon nitride film 14 and the silicon oxide film 13.

Figure 6:
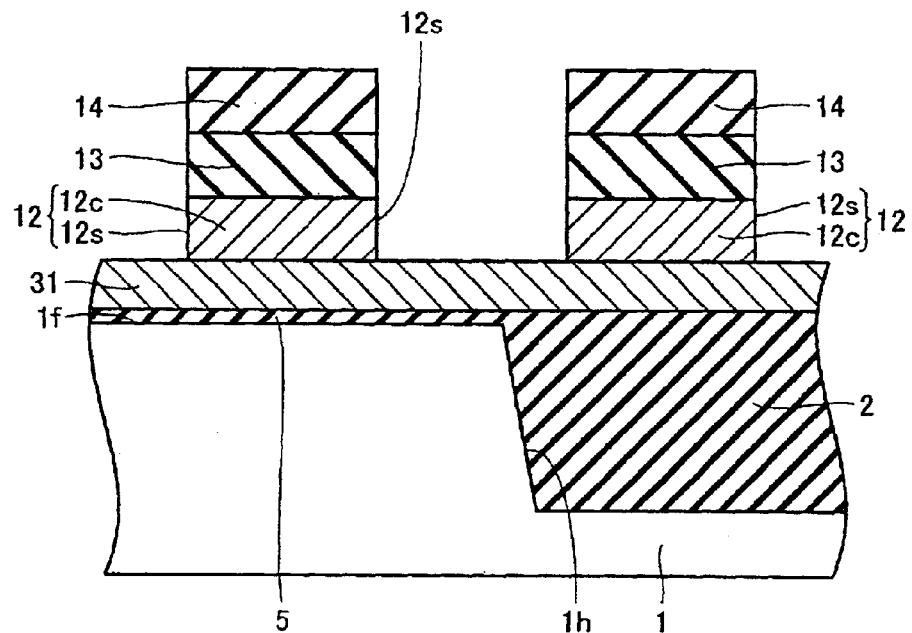

Referring to FIG. 6, the resist pattern 35 is removed and thereafter the silicon nitride film 14 is employed as a mask for etching the tungsten silicide film 32, thereby forming the second conductive layer 12. Then, RTA (rapid thermal anneal) processing is performed for maintaining the second conductive layer 12 in a nitrogen atmosphere for 30 to 60 seconds at a temperature of 850° C. to 1100° C. Thus, portions of the second conductive layer 12 around the side walls 12s are concentrically doped with nitrogen.

Figure 7:
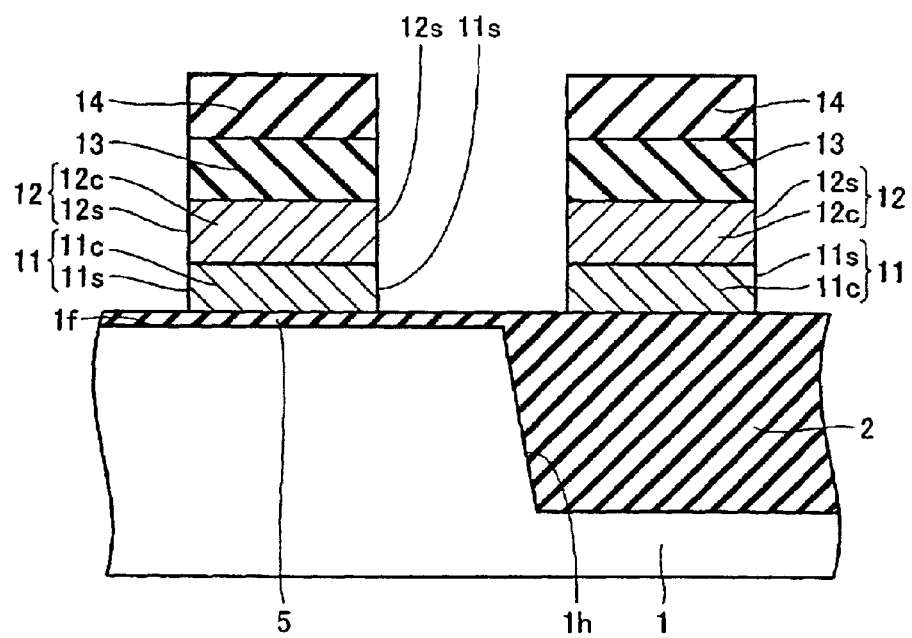

Referring to FIG. 7, the silicon nitride film 14, the silicon oxide film 13 and the second conductive layer 12 are employed as masks for etching the polysilicon film 31, thereby forming the first conductive layer 11. At this time, the first conductive layer 11 has substantially equal widths in the portions in contact with the gate oxide film 5 and the second conductive layer 12 respectively.

Figure 8:
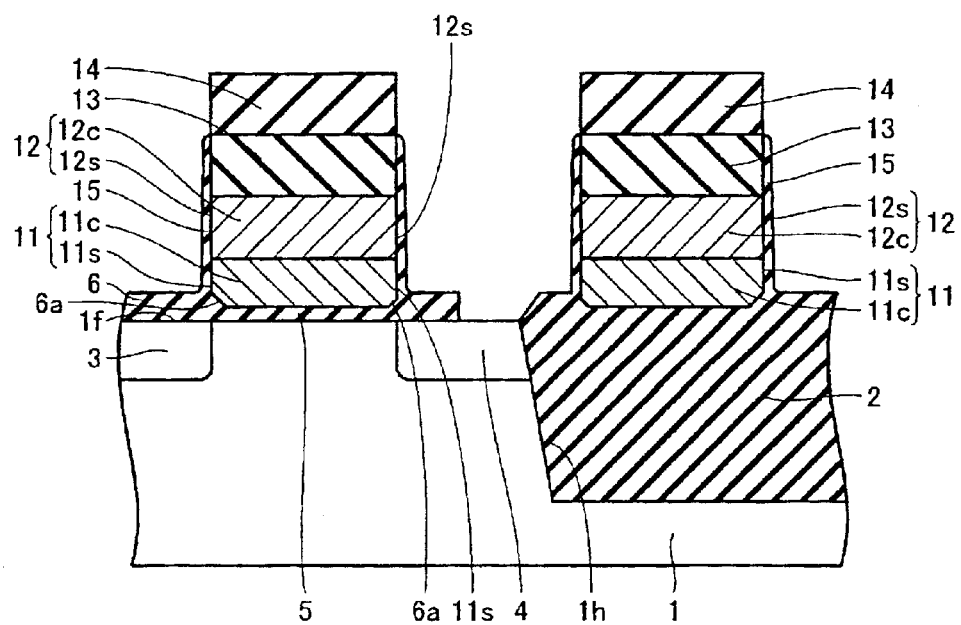

Referring to FIG. 8, the silicon substrate 1 is maintained in an oxygen atmosphere for 30 to 60 seconds at a temperature of 1000° C. to 1150° C., thereby forming the side wall oxide films 15. The side wall oxide films 15 are in contact with the side walls 11s of the first conductive layer 11, the side walls 12s of the second conductive layer 12 and the silicon oxide film 13. The surface oxide film 6 is formed on the main surface 1f of the silicon substrate 1 following this oxidation. A silicon oxide film readily grows on the main surface 1f of the silicon substrate 1, not doped with nitrogen in the RTA step shown in FIG. 6. On the other hand, the side walls 12s of the second conductive layer 12 are doped with large quantities of nitrogen in the step shown in FIG. 6, and hence the side wall oxide films 15 can be inhibited from growing on these portions. The thickness of the surface oxide film 6 is larger than that of the gate oxide film 5.

Figure 9:
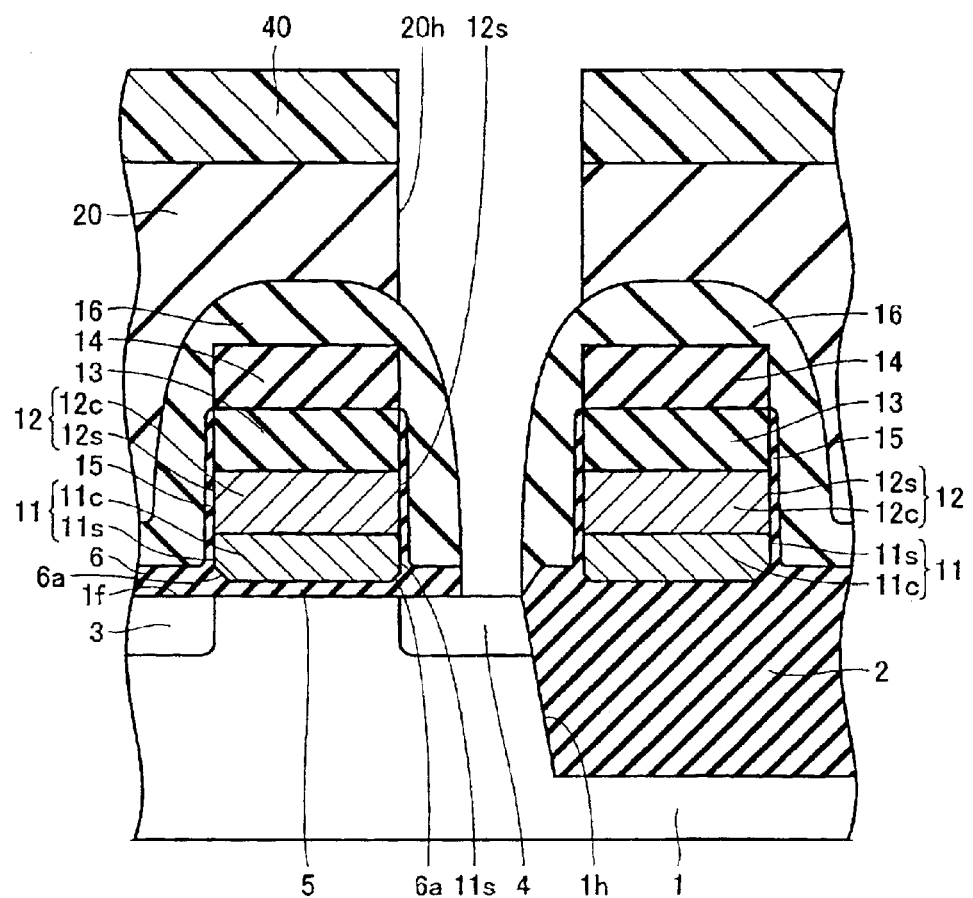
Figure 10:
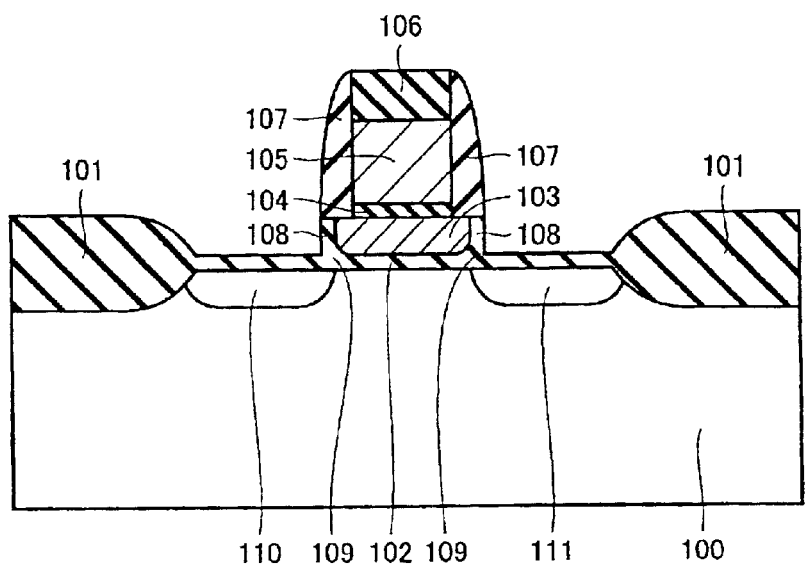
FIG. 10 is a sectional view of a semiconductor device having a conventional electrode structure.

Referring to FIG. 9, the silicon nitride film 16 is formed to cover the side wall oxide films 15 and the surface oxide film 6. The interlayer isolation film 20 of silicon oxide is formed on the silicon nitride film 16. A resist film is applied onto the interlayer isolation film 20 and patterned by photolithography, thereby forming a resist pattern 40. The resist pattern 40 is employed as a mask for etching the interlayer isolation film 20 and the silicon nitride film 16, thereby forming the contact hole 20h reaching the drain region 4 in a self-aligned manner.

Thereafter a polysilicon layer is formed to fill up the contact hole 20h. The polysilicon layer is fully etched back thereby forming the plug layer 23. A polysilicon layer is formed on the plug layer 23 and patterned into a prescribed shape, thereby forming the lower electrode 24. The dielectric layer 21 and the upper electrode 22 are formed on the lower electrode 24 for completing the semiconductor device shown in FIG. 1.

In the electrode structure having the aforementioned structure, the side walls 11s and 12s of the first and second conductive layers 11 and 12 are first oxidized. Therefore, these portions can be prevented from crystal defects and improved in hot carrier resistance.

As shown in FIG. 2, the side walls 12s of the second conductive layer 12 consisting of tungsten silicide contain larger quantities of nitrogen as compared with the side walls 11s of the first conductive layer 11, whereby the side wall oxide films 15 can be prevented from abnormal growth also when the side walls 12s are oxidized in the subsequent step. Therefore, a sufficient space can be ensured between the second conductive layer 12 and the adjacent second conductive layer 12, so that the silicon nitride film 16 and the interlayer isolation film 20 can reliably fill up the space between the adjacent second conductive layers 12.

Further, the side wall oxide films 15 are formed to be directly in contact with the side walls 11s and 12s of the first and second conductive layers 11 and 12. Therefore, sufficient widths can be ensured for the first and second conductive layers 11 and 12, not to increase the electric resistance of the first and second conductive layers 11 and 12. Thus, a reliable electrode structure can be provided.

In addition, the thickness of the surface oxide film 6 is larger than that of the side wall oxide films 15, and the surface oxide film 6 has the bird's beaks 6a. The bird's beaks 6a are formed to cut into the first conductive layer 11, thereby increasing the distances between the source and drain regions 3 and 4 and the first conductive layer 11. Thus, GIDL (gate induced drain leakage) resulting from an electric field can be suppressed between the first conductive layer 11 and the drain region 4. Therefore, deterioration of a pause refresh property can be prevented in the DRAM shown in FIG. 1.

The first embodiment described above can be modified in various ways. First, the first conductive layer 11 can be prepared by doping the aforementioned amorphous silicon or polysilicon with an impurity such as phosphorus or arsenic. The second conductive layer 12 may contain a high melting point metal and silicon. The first conductive layer 11, the second conductive layer 12, the silicon oxide film 13 and the silicon nitride film 14 can be formed by CVD (chemical vapor deposition).

Further, the contact hole 20h may be formed not by the self-aligned method shown in FIG. 9 but by a general method employing only the resist pattern 40 as a mask.

According to the present invention, a sufficient width can be ensured for the second conductive layer for providing a reliable electrode structure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electrode structure comprising:
   a first conductive layer having a first side wall and containing at least either polycrystalline silicon or amorphous silicon;
   a second conductive layer, formed on said first conductive layer, having a second side wall and containing a metal and silicon; and
   a side wall oxide film formed to be in contact with said first side wall and said second side wall, wherein
   said first conductive layer and said second conductive layer contain nitrogen in the vicinity of said first and second side walls, and
   the nitrogen concentration in said second side wall is larger than the nitrogen concentration in said first side wall.

2. The electrode structure according to claim 1, wherein the nitrogen concentration in said second conductive layer is increased toward said second side wall.

3. The electrode structure according to claim 1, wherein the nitrogen concentration in said first side wall is substantially identical to the nitrogen concentration in a central portion of said first conductive layer.

4. The electrode structure according to claim 1, wherein said first conductive layer is formed on a semiconductor substrate.

5. The electrode structure according to claim 4, further comprising a gate oxide film formed between said first conductive layer and said semiconductor substrate.

6. The electrode structure according to claim 5, further comprising a surface oxide film formed on said semiconductor substrate continuing to said gate oxide film and said side wall oxide film.

7. The electrode structure according to claim 1, further comprising a silicon nitride film formed to cover said side wall oxide film.

8. The electrode structure according to claim 1, further comprising a silicon oxide film overlying the second conductive layer.

9. The electrode structure according to claim 8, wherein the width of the silicon oxide film is substantially the same as the width of the first and second conductive layers.

10. The electrode structure according to claim 8, further comprising a first silicon nitride film overlying the silicon oxide film.

11. The electrode structure according to claim 10, wherein the width of the first silicon nitride film is substantially the same as the width of the first and second conductive layers.

12. The electrode structure according to claim 10, further comprising a second silicon nitride film overlying the first silicon nitride film and the side wall oxide film.

13. An electrode structure comprising:
   a first conductive layer formed on a semiconductor substrate having a first side wall and containing at least either polycrystalline silicon or amorphous silicon, wherein said first conductive layer has a portion reduced in width toward said semiconductor substrate;
   a second conductive layer, formed on said first conductive layer, having a second side wall and containing a metal and silicon; and
   a side wall oxide film formed to be in contact with said first side wall and said second side wall, wherein
   said first conductive layer and said second conductive layer contain nitrogen in the vicinity of said first and second side walls, and
   the nitrogen concentration in said second side wall is larger than the nitrogen concentration in said first side wall; and
   impurity regions formed on said semiconductor substrate on both sides of said first conductive layer.

* * * * *